United States Patent [19]

Moyer

[11] Patent Number: 4,755,474
[45] Date of Patent: Jul. 5, 1988

[54] METHOD OF ASSEMBLING AN OPTOCOUPLER

[75] Inventor: Curtis D. Moyer, Phoenix, Ariz.

[73] Assignee: Motorola Inc., Schaumburg, Ill.

[21] Appl. No.: 944,125

[22] Filed: Dec. 22, 1986

[51] Int. Cl.⁴ .................................... H01L 31/12
[52] U.S. Cl. .................................... 437/3; 437/906; 437/8; 437/209; 357/17; 357/19; 250/551
[58] Field of Search .................. 29/588, 589, 574; 250/551; 357/19, 17, 16; 437/906, 3, 8, 209

[56] References Cited

U.S. PATENT DOCUMENTS

| | | | |
|---|---|---|---|
| 4,058,821 | 11/1977 | Miyoshi et al. | 357/19 |
| 4,100,562 | 7/1978 | Sugawara et al. | 357/19 |
| 4,136,351 | 1/1979 | Sugawara et al. | 357/17 |
| 4,156,148 | 5/1979 | Kaufman | 250/551 |
| 4,160,308 | 7/1979 | Courtney et al. | 29/588 |
| 4,478,588 | 10/1984 | Lockard | 29/588 |
| 4,590,667 | 5/1986 | Simon | 29/588 |
| 4,633,582 | 1/1987 | Ching et al. | 250/551 |

Primary Examiner—Brian E. Hearn
Assistant Examiner—Beverly Ann Pawlikowski
Attorney, Agent, or Firm—Dale E. Jepsen

[57] ABSTRACT

A method of manufacturing optocoupler devices is provided wherein individual light emitting chips are mounted to a plurality of photodetector chips still in wafer form such that testing of the emitter detector pairs may be accomplished prior to dicing of the photodetector chip and mounting of the emitter detector pairs.

14 Claims, 2 Drawing Sheets

– PRIOR ART –

METHOD OF ASSEMBLING AN OPTOCOUPLER

BACKGROUND OF THE INVENTION

This invention relates generally to optocoupler devices and more particularly, to a method of manufacturing such devices wherein an emitter detector combination may be tested prior to mounting on a lead frame and encapsulation.

There are various commercially available optocoupler devices which basically comprise a semiconductor detector and a semiconductor emitter separated by a transparent dielectric material to provide electrical insulation between the detector and emitter. Most currently available devices are manufactured in such a manner that the emitter and detector portions of the device are separately and individually mounted to a lead frame and tested separately prior to their combination into a single optocoupler device. In addition to various testing steps, most current methods of manufacture require a relatively critical alignment between the two separate lead frames with attached emitter and detector elements during the final stages of construction. In addition, there is normally not a test of the emitter detector combination until the entire device has been attached to the lead frame and in some cases after encapsulation. While some prior art devices do provide for the direct attachment of the emitter device to a dielectric material which has been applied to the detector device and therefore a relatively tight control of the coupling between the two devices, even this method requires the separate attachment of the emitter and detector circuits to a separate lead frame prior to any testing of the combination.

It would therefore be desirable to provide a method of assembling an optocoupler device which would reduce or eliminate critical lead frame alignments, eliminate multiple plastic molds, improve optical coupling, and allow testing of a die pair comprising an emitter and a detector prior to mounting on a lead frame or encapsulation.

SUMMARY OF THE INVENTION

It is therefore an object of the present invention to provide an improved method of assembling an optocoupler device wherein the emitter and detector portions are coupled directly to a dielectric material prior to their attachment to a lead frame.

It is a further object of the present invention to provide an improved method of assembling an optocoupler device wherein the combination of a emitter and detector may be tested prior to attachment to a lead frame or encapsulation.

It is a still further object of the present invention to provide an optocoupler device having improved optical coupling and reduced height.

The foregoing and other objects are achieved in the present invention wherein there is provided a method of assembling an optocoupler device comprising the steps of constructing a wafer containing a plurality of separate photodetector chips, applying a layer of dielectric material to selected portions of the detector wafer, constructing a plurality of individual light emitting circuit chips such as light emitting diodes, attaching one of these emitter chips to each detector chip on the detector wafer, dicing the detector wafer into separate emitter detector pairs and attaching each emitter detector pair to a lead frame. This method allows testing of the individual emitter detector pairs while still mounted on the detector wafer. The individual emitter detector pairs could also be surface mounted rather than attached to a lead frame.

BRIEF DESCRIPTION OF THE DRAWINGS

The above-mentioned and other features and objects of the present invention and the manner of attaining them will become more apparent and the invention itself will be best understood by reference to the following description of an embodiment of the invention taken in conjunction with the accompanying drawings wherein.

DESCRIPTION OF A PREFERRED EMBODIMENT

Figure 1:
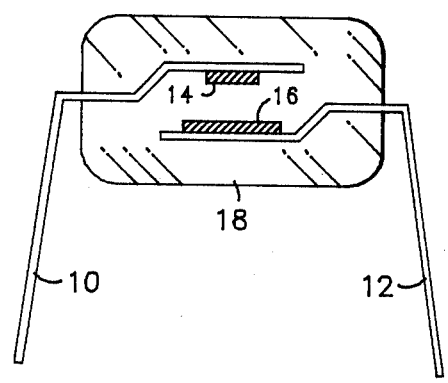
FIG. 1 is a simplified cross-sectional view of a prior art device.
Figure 2A:
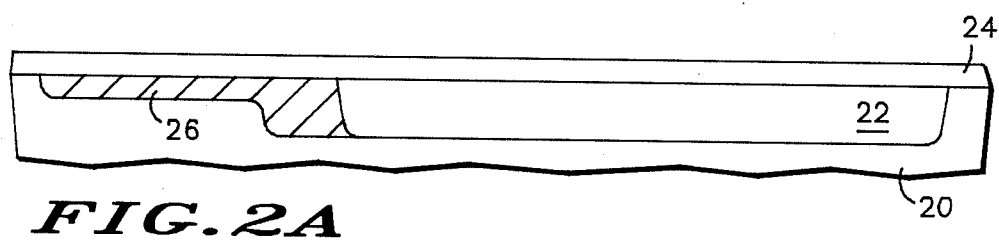
FIG. 2 is a pictorial description of the method of the present invention.
Figure 2B:
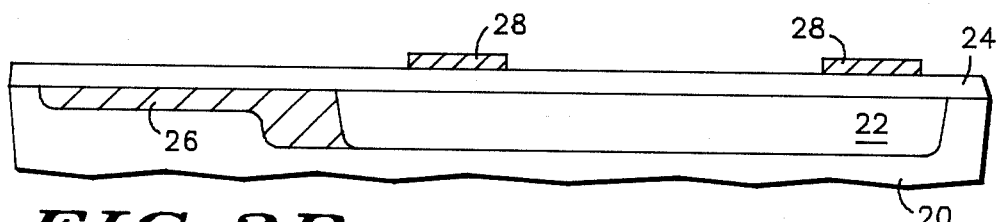
Figure 2C:
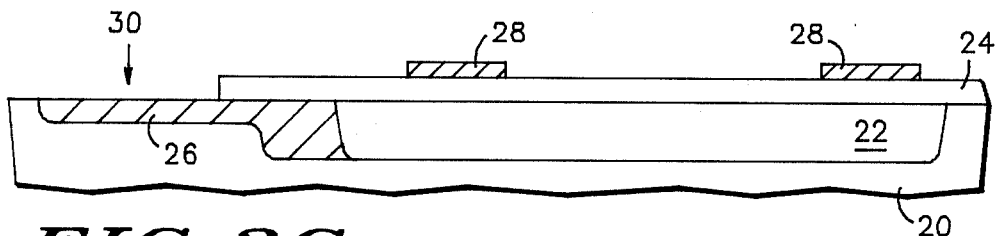
Figure 2D:
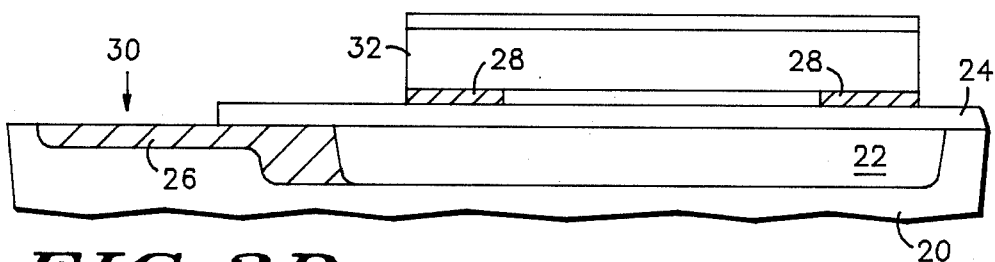

Referring now to FIG. 1 there is shown a cross-sectional view of a prior art device such as Motorola Part No. H11D1. During construction of this device the emitter device 14 is separately attached to lead frame 10 and detector device 16 is separately attached to lead frame 12. Separate lead frames 10 and 12 are then aligned in a relatively critical step which requires very accurate horizontal and vertical spacing of elements 14 and 16. An optically transparent dielectric material is then applied to surround both elements 14 and 16 thereby providing an optical path between elements 14 and 16 and providing electrical insulation between elements 14 and 16 and lead frames 10 and 12. Any testing to determine either the optical coupling between elements 14 ahd 16 or the electrical isolation therebetween cannot be accomplished therefore until the individual die have been attached to lead frames 10 and 12, lead frames 10 and 12 have been alligned and dielectic material added. While defective devices can at this point be detected by various testing steps, the expensive lead frame attachment and molding steps have already been accomplished and thus a relatively large amount of the investment in terms of both time and material has been made prior to the detection of failures related to allignment or electrical isolation.

There are other various prior art methods of assembling an optocoupler device, some of which include the use of a preformed sheet of dielectric material which is attached directly to a detector having a lead frame attached thereto. An emitter device having a lead frame attached thereto is then applied directly to the dielectric material attached to the detector device. This method does provide a simpler method of establishing the vertical separation between the emitter and detector and therefore improves the optical coupling, however the final testing of the emitter detector pair must still be accomplished after the individual lead frames are attached and the entire device encapsulated.

FIG. 2 illustrates the steps of the method of the present invention wherein emitter detector pairs may be tested and deffective pairs isolated prior to mounting on a lead frame or encapsulation. During the first step of the preferred method a wafer containing photodetector devices would be manufactured in a conventional manner. A layer of dielectric material would then applied directly to this entire wafer containing a plurality of individual photodetector integrated circuits or chips. This dielectric layer is illustrated for example as layer 24 above photodetector layer 22. Area 26 represents the wire bond areas of the detector wafer which are used to attach conductors to the appropriate leads of the individual detector chips. Once the wafer containing a plurality of detector chips has been constructed, a layer of dielectric material is applied directly to the entire wafer at predetermined locations. This layer of dielectric material should be optically transparent and should provide the desired dielectric strength, for example on the order of 7 kilovolts for current state of the art devices. This dielectric layer may be applied in any of several different conventional methods such as a glass sinter layer. The specific predetermined areas may be established in any of several different conventional methods such as, for example, by etching away specific areas of the dielectric layer once it has been applied to the detector wafer or by using a mask during application of the dielectric layer. This allows access through the dielectric layer to attachment points such as wire bond area 30 of the detector chip.

Once the dielectric has been applied, the entire wafer may be tested to determine which specific detector chips on the wafer, if any, are defective. Defective chips are marked to be later identified. Separate light emitting chips, such as GaAs LED's, are then constructed in any conventional manner. Selected individual light emitting diode chips 32 which have been previously tested are then individually applied to individual detector chips on the detector wafer which have not been marked as defective. This application step may be accomplished in a conventional manner such as via a die attach metal pattern 28 applied to the dielectric layer.

Figure 3:
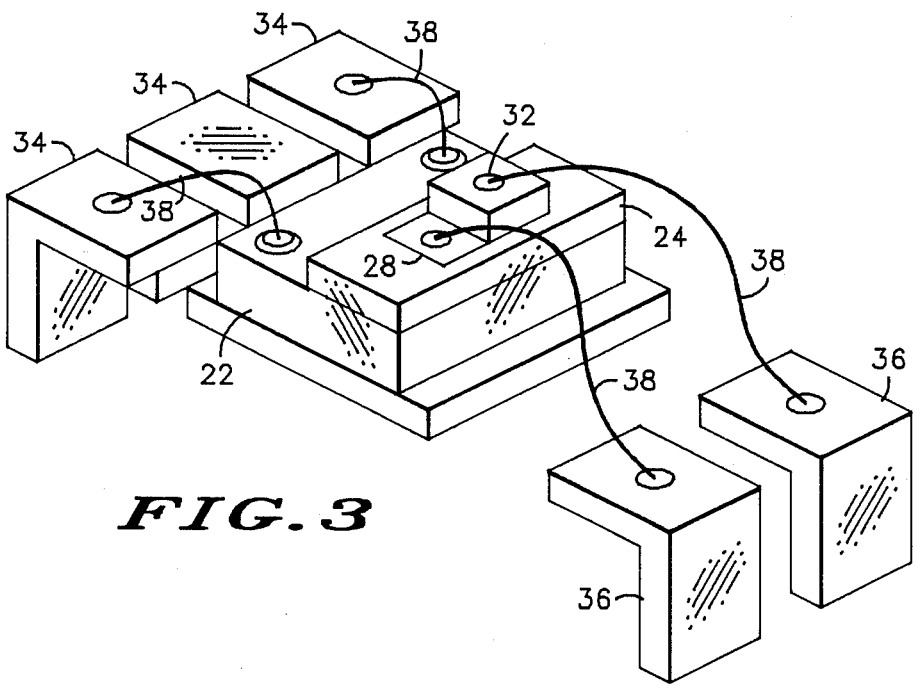
FIG. 3 is an isometric view of a preferred embodiment of a device which has been constructed in accordance with the method of the present invention.

At this point, with the LED chips applied to the silicon detector wafer, the individual emitter detector die pairs may be tested as a unit using conventional testing methods such as a test probe pad applied to each individual die pair. Once the testing has been accomplished and defective die pairs identified the detector wafer is diced into individual die pair units which are then mounted on a single lead frame. Wire bonds are then connected from the individual leads of the lead frame to the contact pads previously constructed as part of the individual detector and emitter chips. The entire device is then encapsulated in opaque material using conventional techniques. The completed device is shown in FIG. 3 which illustrates individual LED 32 which has been mounted on a individual silicon detector 22 and separated therefrom by a specific portion of the isolation dielectric layer 24. FIG. 3 also illustrates the wire bonds leading from the individual LED 32 and silicon detector 22 to appropriate leads of the lead frame. In the alternative, the emitter detector pair could be surface mounted to a desired receptacle using conventional techniques.

An alternative to applying the dielectric material to the detector wafer is to construct an LED wafer with light emission from one face and both electrical contacts on the opposite face. The dielectric material is then applied without patterning or metalization to the light emission face of the LED wafer. The LED wafer is then tested and sawn and LED die with the insulating dielectric applied are mounted directly on the detector wafer.

While there have been described above the principles of the invention in conjunction with a specific method, it is to be clearly understood that these descriptions are made only by an example and not as a limitation to the scope of the invention.

I claim:

1. A method of manufacturing optocoupler devices comprising the steps of:
    forming a plurality of semiconductor photodetector chips on a wafer;
    applying a dielectric layer to predetermined portions of said wafer;
    forming individual semiconductor light emitting chips;
    mounting one of said light emitting chips at a predetermined location on said dielectric layer above each of said photodetector chips to form photodetector chip light emitting chip pairs; and
    dicing said wafer into individual pairs, each of which comprises a photodetector chip and a light emitting chip.

2. The method of claim 1 wherein said mounting step comprises applying a metal attach layer to predetermined portions of said dielectric layer.

3. The method of claim 1 further comprising the step of mounting each of said individual pairs on a lead frame.

4. The method of claim 3 further comprising the step of attaching wire leads to predetermined portions of said individual pairs and said lead frames.

5. The method of claim 1 wherein said step of applying comprises applying said dielectric layer to the entire surface of said wafer, then etching away selected portions of said dielectric layer.

6. The method of claim 1 wherein said step of applying comprises applying a mask to said wafer, then applying said dielectric layer, then removing said mask along with portions of said dielectric layer.

7. The method of claim 1 further comprising the step of testing each of said photodetector chips after said applying step.

8. The method of claim 1 further comprising the step of testing said photodetector chip light emitting chip pairs prior to said dicing step.

9. The method of claim 4 further comprising the step of encapsulating each of said individual pairs in an opaque material.

10. A method of manufacturing optocoupler devices comprising the steps of:
    forming a plurality of semiconductor photodetector chips on a first wafer;
    forming a plurality of semiconductor light emitting chips on a second wafer;
    applying a dielectric layer to one face of said second wafer;
    dicing said second wafer into individual semiconductor light emitting chips;
    mounting one of said light emitting chips at a predetermined location on said first wafer to form photodetector chip light emitting chip pairs; and
    dicing said first wafer into individual pairs, each of which comprises a photodetector chip and a light emitting chip.

11. The method of claim 10 further comprising the step of mounting each of said individual pairs on a lead frame.

12. The method of claim 11 further comprising the step of attaching wire leads to predetermined portions of said individual pairs and said lead frames.

13. The method of claim 10 further comprising the step of testing said photodetector chip light emitting chip pairs prior to said dicing of said first wafer.

14. The method of claim 12 further comprising the step of encapsulating each of said individual pairs in an opaque material.

* * * * *